United States Patent
Kawahara

(10) Patent No.: US 11,329,454 B2
(45) Date of Patent: May 10, 2022

(54) METHOD OF MANUFACTURING SEMICONDUCTOR DEVICE

(71) Applicant: Mitsubishi Electric Corporation, Tokyo (JP)

(72) Inventor: Hiroyuki Kawahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/963,201

(22) PCT Filed: Mar. 26, 2018

(86) PCT No.: PCT/JP2018/012095
§ 371 (c)(1),
(2) Date: Jul. 17, 2020

(87) PCT Pub. No.: WO2019/186638
PCT Pub. Date: Oct. 3, 2019

(65) Prior Publication Data
US 2021/0126432 A1    Apr. 29, 2021

(51) Int. Cl.
*H01S 5/02*     (2006.01)
*H01S 5/227*    (2006.01)
(Continued)

(52) U.S. Cl.
CPC .......... *H01S 5/2275* (2013.01); *H01S 5/0203* (2013.01); *H01S 5/0205* (2013.01);
(Continued)

(58) Field of Classification Search
CPC . H01S 5/026512; H01S 5/1231; H01S 5/2275
See application file for complete search history.

(56) References Cited

U.S. PATENT DOCUMENTS

| 4,270,096 A | 5/1981 | Hayashi et al. |
| 5,723,360 A | 3/1998 | Iwasaki |

(Continued)

FOREIGN PATENT DOCUMENTS

| CN | 104868360 A | 8/2015 |
| JP | S54-154984 A | 12/1979 |

(Continued)

OTHER PUBLICATIONS

International Search Report issued in PCT/JP2018/012095; dated May 22, 2018.
(Continued)

*Primary Examiner* — Michael Carter
(74) *Attorney, Agent, or Firm* — Studebaker & Brackett PC

(57) ABSTRACT

What is provided here are: a step of forming a first semiconductor layer on a base member; a step of forming a mask on the first semiconductor layer; a step of etching the first semiconductor layer by using the mask, to thereby form a semiconductor structure; a step of forming a second semiconductor layer in a region abutting on a side surface of the semiconductor structure, said second semiconductor layer having a convex portion abutting to the mask; a convex-portion removing step of removing the convex portion by supplying an etching gas thereto; and a regrown-layer forming step of supplying a material gas onto the semiconductor structure and the second semiconductor layer, to thereby form a regrown layer; wherein the convex-portion removing step and the regrown-layer forming step are executed in a same manufacturing apparatus.

20 Claims, 8 Drawing Sheets

(51) Int. Cl.
*H01S 5/125* (2006.01)
*H01S 5/323* (2006.01)
*H01S 5/026* (2006.01)
*H01S 5/12* (2021.01)

(52) U.S. Cl.
CPC ............ *H01S 5/0265* (2013.01); *H01S 5/125* (2013.01); *H01S 5/1231* (2013.01); *H01S 5/32391* (2013.01); *H01S 5/12* (2013.01)

(56) References Cited

U.S. PATENT DOCUMENTS

| | | | | |
|---|---|---|---|---|
| 5,948,161 | A * | 9/1999 | Kizuki | H01L 21/02395 117/89 |
| 6,358,316 | B1 | 3/2002 | Kizuki et al. | |
| 2003/0042495 | A1* | 3/2003 | Ogasawara | H01S 5/227 257/102 |
| 2007/0195847 | A1* | 8/2007 | Fukamachi | H01S 5/22 372/46.01 |
| 2008/0137703 | A1* | 6/2008 | Iga | B82Y 20/00 372/46.01 |
| 2009/0305483 | A1 | 12/2009 | Tanaka | |
| 2014/0367640 | A1* | 12/2014 | Fujii | H01L 33/30 257/13 |
| 2015/0244152 | A1* | 8/2015 | Tsunami | H01S 5/34313 438/31 |

FOREIGN PATENT DOCUMENTS

| | | |
|---|---|---|
| JP | H06-232099 A | 8/1994 |
| JP | H07-211692 A | 8/1995 |
| JP | H07-263355 A | 10/1995 |
| JP | 2001-053391 A | 2/2001 |
| JP | 2015-162500 A | 9/2015 |
| TW | 201017729 A | 5/2010 |
| TW | 201533804 A | 9/2015 |

OTHER PUBLICATIONS

An Office Action mailed by China National Intellectual Property Administration dated Dec. 15, 2021, which corresponds to Chinese Patent Application No. 201880091538.4 and is related to U.S. Appl. No. 16/963,201 with English language translation.

* cited by examiner

METHOD OF MANUFACTURING SEMICONDUCTOR DEVICE

TECHNICAL FIELD

The present invention relates to a method of manufacturing a semiconductor device.

BACKGROUND ART

When a semiconductor device is to be manufactured, partial etching using an insulative-film mask and regrowth processing are performed in many cases. For example, in the case of manufacturing a semiconductor laser having a mesa structure, using a stripe-shaped insulative-film mask, etching is applied to a semiconductor layer stacked on a substrate, to thereby form the mesa structure; semi-insulative burying layers are grown on both sides of the mesa structure; the mask is removed; and then a cladding layer and a contact layer are regrown on the mesa structure and the burying layers.

When a semiconductor laser is manufactured according to the above method, the volume of the burying layer in the vicinity of the mask becomes large due to selective growth effect, resulting in creation of a convex portion on its surface after removal of the mask. If the cladding layer and the contact layer are grown on such a surface structure having locally different heights, because of differences in growth rate between the respective plane orientations, dislocations will be propagated. As a result, pits are produced in the surface of the semiconductor laser, thus causing poor appearance, abnormal etching at a later etching step, and the like.

As a means for solving this problem, a method is known in which the cladding layer is regrown after the convex portion is removed by wet etching (for example, Patent Document 1).

CITATION LIST

Patent Document

Patent Document 1: Japanese Patent Application Laid-open No. 2015-162500

SUMMARY OF THE INVENTION

Problems to be Solved by the Invention

However, in the case where the convex portion is removed by wet etching, because the manufacturing apparatus used in the wet etching step is different to that used in the following regrowth step of the cladding layer, the necessity arises that the thus-partially manufactured semiconductor device is exposed to the atmosphere after that wet etching. In that case, the surface cannot be kept in a clean state.

This invention has been made to solve the foregoing problem, and an object thereof is to provide a method of manufacturing a semiconductor device by which a semiconductor layer can be regrown on the surface in a clean state.

Means for Solving the Problems

A method of manufacturing a semiconductor device according to the invention comprises: a step of forming a first semiconductor layer on a base member; a step of forming a mask on the first semiconductor layer; a step of etching the first semiconductor layer by using the mask, to thereby form a semiconductor structure; a step of forming a second semiconductor layer in a region abutting on a side surface of the semiconductor structure, said second semiconductor layer having a convex portion abutting to the mask; a convex-portion removing step of removing the convex portion by supplying an etching gas thereto; and a regrown-layer forming step of supplying a material gas onto the semiconductor structure and the second semiconductor layer, to thereby form a regrown layer; wherein the convex-portion removing step and the regrown-layer forming step are executed in a same manufacturing apparatus.

Effect of the Invention

When the manufacturing method of this invention is used, since the removal of the convex portion and the following regrowth of the semiconductor layer are executed in a same manufacturing apparatus, it is possible to manufacture a semiconductor device in which a semiconductor layer has been regrown on the surface in a clean state.

MODES FOR CARRYING OUT THE INVENTION

Embodiment 1

A method of manufacturing a semiconductor laser according to Embodiment 1 will be described. In FIGS. 2 to 3 for use in the description, laser light is emitted from the semiconductor laser in a direction perpendicular to the paper.

Figure 2A:
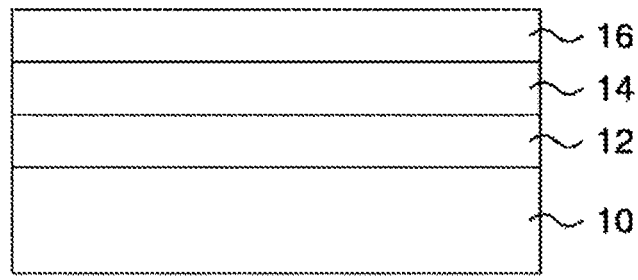
FIGS. 2A to 2D are cross-sectional views representing the method of manufacturing a semiconductor laser according to Embodiment 1.
Figure 2B:
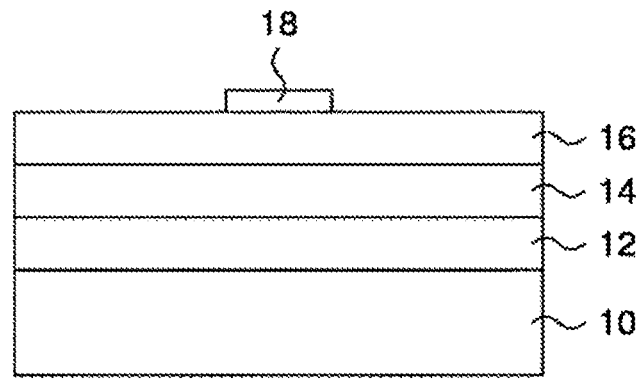
Figure 2C:
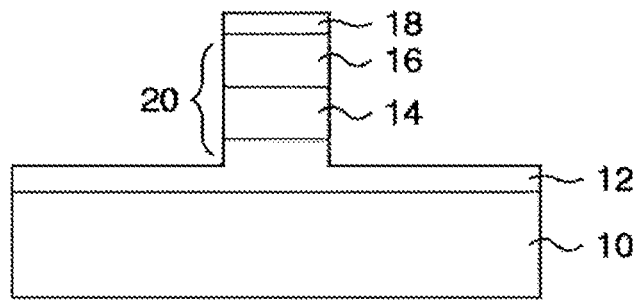
Figure 2D:
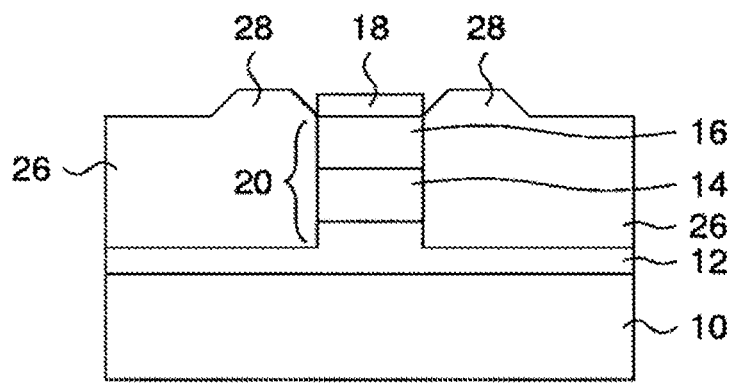

First, as shown in FIG. 2A, on an n-type InP substrate 10 serving as a base member, an n-type InP cladding layer 12, an InGaAsP active layer 14 and a first p-type InP cladding layer 16 are epitaxially grown successively. Then, as shown in FIG. 2B, an $SiO_2$ film is deposited and photo-etching using a resist pattern is applied thereto, to thereby form a stripe-shaped $SiO_2$ mask 18. Then, as shown in FIG. 2C, RIE (Reactive Ion Etching) as dry etching is applied so as to etch the portions uncovered by the $SiO_2$ mask 18 up to an intermediate position in the n-type InP cladding layer 12, to thereby form a mesa structure 20. Then, as shown in FIG. 2D, in each of regions abutting on side surfaces of the mesa structure 20, a semi-insulative InP burying layer 26 is grown. The InP burying layer 26 functions as a current blocking layer. For the reason to be described later, a convex portion 28 is formed on a surface of each InP burying layer 26 in the vicinity of the $SiO_2$ mask 18. Then, using hydrofluoric acid, the $SiO_2$ mask 18 is removed to thereby achieve a structure of FIG. 3A.

The reason why the convex portion 28 is formed on the surface of the InP burying layer 26 is that crystal growth is promoted in the vicinity of the $SiO_2$ mask 18. The material supplied onto the surface of the mask will flow on the surface of the mask to the right and left sides, to contribute the growth of the InP burying layer 26 in the vicinity of the mask. Accordingly, the crystal growth in the vicinity of the mask is faster than that at another area, so that the convex portion 28 is formed.

Figure 3A:
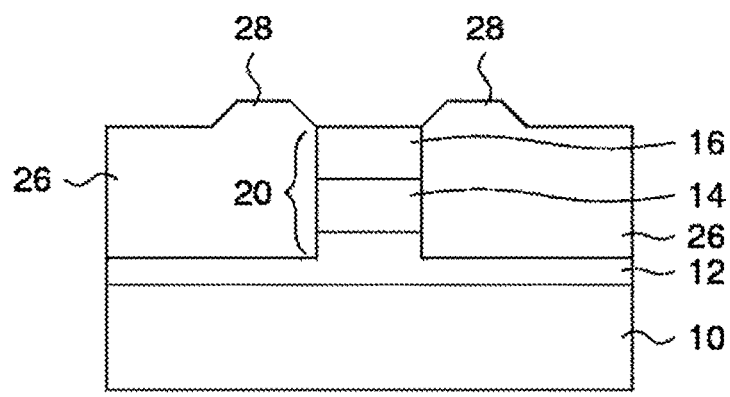
FIGS. 3A to 3D are cross-sectional views representing the method of manufacturing a semiconductor laser according to Embodiment 1.
Figure 3B:
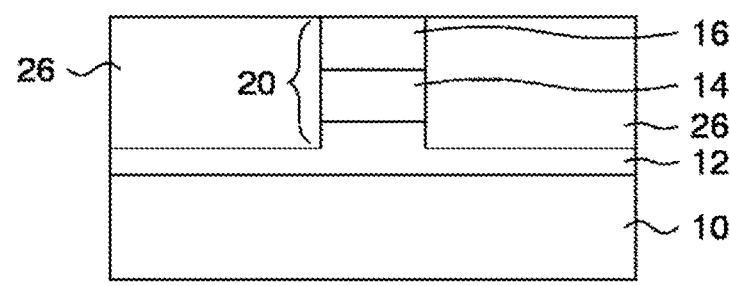

After the formation of the structure of FIG. 3A, as shown in FIG. 3B, the convex portion 28 is removed by etching using an HCl gas. Hereinafter, this step is referred to as a convex-portion removing step.

Figure 4A:
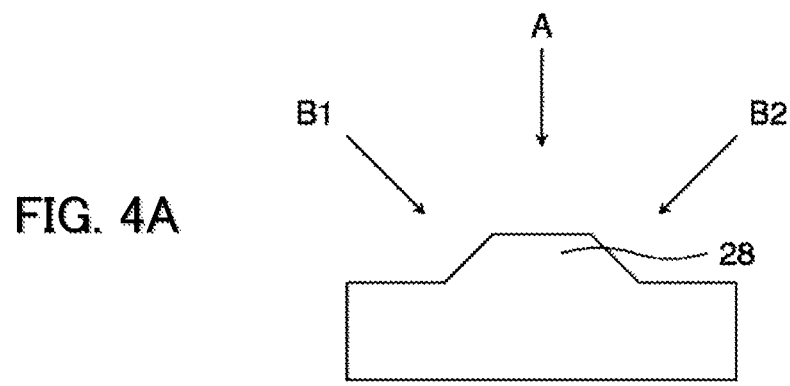
FIGS. 4A to 4C are cross-sectional views showing how a convex portion is removed.
Figure 4B:
Figure 4C:
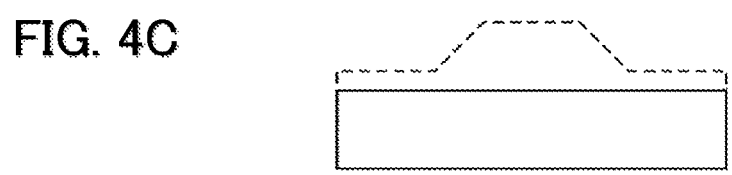

The scheme by which the convex portion 28 is removed is as follows. According to the etching using an HCL gas, there is an etching-rate dependence on crystal plane orientation, so that an etching rate at (111) B plane is higher than that at (001) plane. In FIG. 4A, the convex portion 28, an arrow A indicating a direction perpendicular to (001) plane and arrows B1, B2 each indicating a direction perpendicular to (111) B plane, are drawn. When the etching is started from the state of FIG. 4A, the convex portion becomes smaller with the progress of the etching as shown in FIG. 4B, so that the convex portion is finally removed as shown in FIG. 4C.

Figure 3C:
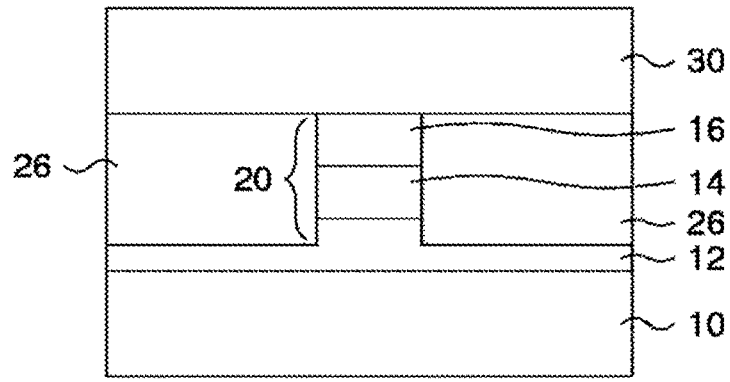
Figure 3D:
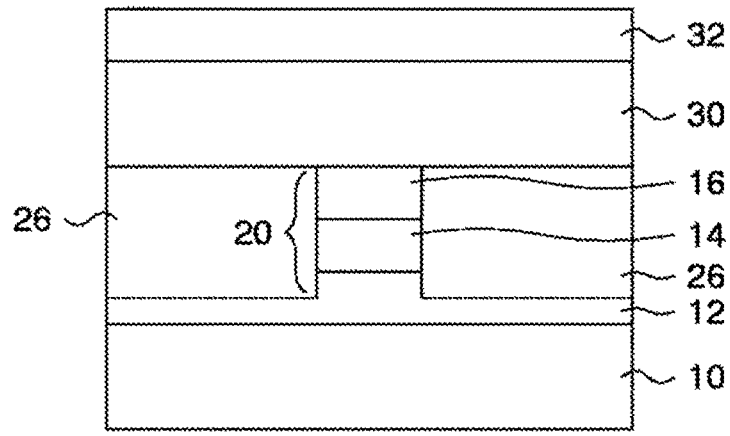

After the removal of the convex portion, under the condition that the thus-partially manufactured semiconductor laser is not taken out from the manufacturing apparatus, a second p-type InP cladding layer 30 is regrown thereon in such a manner that the supply of the HCl gas is stopped but a TMI (trimethyl indium) gas as a material gas is flowed, to thereby achieve a structure shown in FIG. 3C. Hereinafter, this step is referred to as a regrown-layer forming step. Further, a p-type InGaAs contact layer 32 is grown thereon, so that a basic crystalline structure for the semiconductor laser shown in FIG. 3D is achieved.

Figure 1:
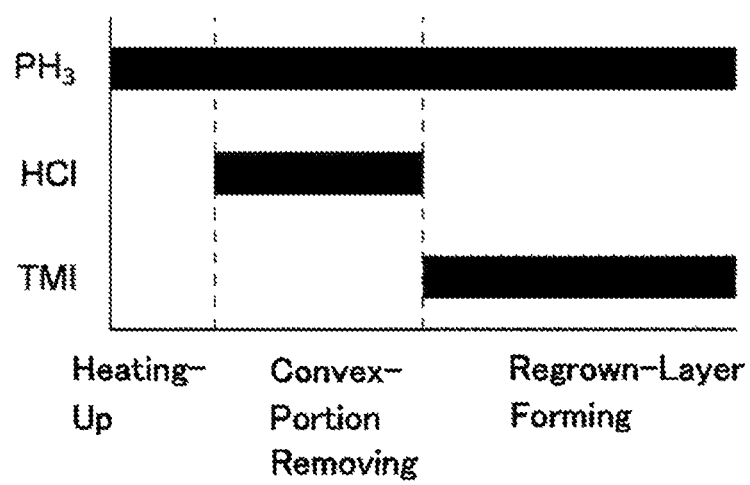
FIG. 1 is a diagram showing gas supply conditions in a method of manufacturing a semiconductor laser according to Embodiment 1.

In FIG. 1, the gas supply conditions are shown. In the convex-portion removing step, the removal of the convex portion is executed by the supply of the HCl gas. In the following regrown-layer forming step, the supply of the HCl gas is stopped but the TMI gas is supplied, so that the second p-type InP cladding layer 30 is regrown. Note that the reason that $PH_3$ (phosphine) is supplied before the removal of the convex portion and during heating-up of the inside of the manufacturing apparatus, is to prevent the element P from getting away from the InP burying layer 26.

When a semiconductor laser is manufactured using the manufacturing method according to Embodiment 1, the convex-portion-removed InP burying layer 26 is obtained.

Accordingly, the second p-type InP cladding layer 30 and the p-type InGaAs contact layer 32 can be grown flat. If the convex portion is remaining and the second p-type InP cladding layer 30 and the p-type InGaAs contact layer 32 are grown thereon, because of differences in growth rate between the respective plane orientations, dislocations will be propagated. As a result, pits are produced in the surface of the semiconductor laser, thus causing poor appearance, abnormal etching at a later etching step, and the like. In contrast, when the manufacturing method according to Embodiment 1 is used, a semiconductor laser without such troubles as described above is achieved.

Further, since the convex-portion removing step and the regrown-layer forming step are successively executed in the same manufacturing apparatus, the surfaces of the InP burying layers 26 and the mesa structure 20, after the removal of the convex portion, are not exposed to the atmosphere. Thus, while these surfaces are kept in a clean state, the second p-type InP cladding layer 30 can be grown thereon.

Further, in comparison with a case where the removal of the convex portion is executed by wet etching, the number of manufacturing steps can be reduced.

Embodiment 2

A method of manufacturing a semiconductor laser according to Embodiment 2 will be described. Here, its steps similar to those in the manufacturing method according to Embodiment 1 will not be detailed, so that description will be made mainly on the difference from Embodiment 1. With respect also to an effect to be created, description will be made mainly on the difference from Embodiment 1.

Figure 5:
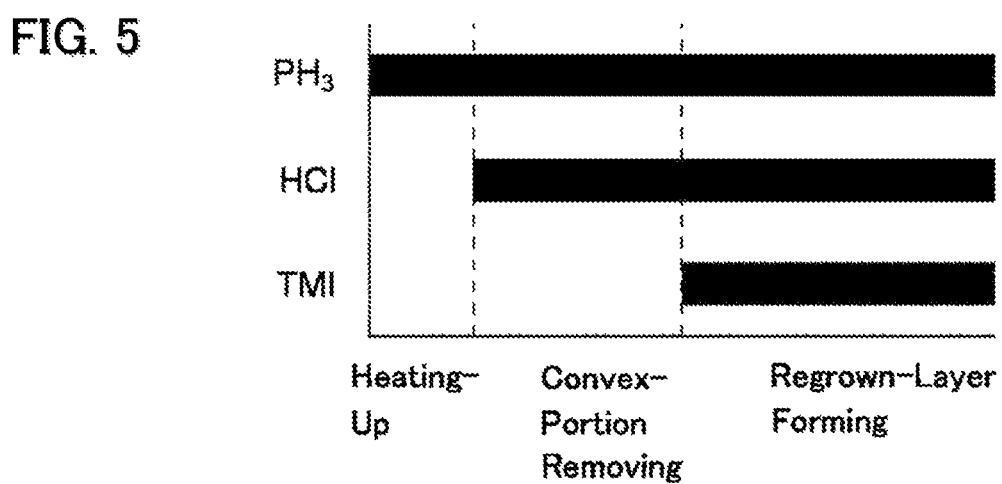
FIG. 5 is a diagram showing gas supply conditions in a method of manufacturing a semiconductor laser according to Embodiment 2.

Gas supply conditions in the manufacturing method according to Embodiment 2 are shown in FIG. 5. The difference from Embodiment 1 resides in that the supply of the HCl gas is continued even in the regrown-layer forming step.

In the manufacturing method according to Embodiment 2, since the HCl gas is supplied even in the regrown-layer forming step, if the convex portion could not completely be removed after the completion of the convex-portion removing step, such a convex portion will be removed in the following regrown-layer forming step.

Embodiment 3

A method of manufacturing a semiconductor laser according to Embodiment 3 will be described. Here, its steps similar to those in the manufacturing method according to Embodiment 1 will not be detailed, so that description will be made mainly on the difference from Embodiment 1. With respect also to an effect to be created, description will be made mainly on the difference from Embodiment 1.

Figure 6:
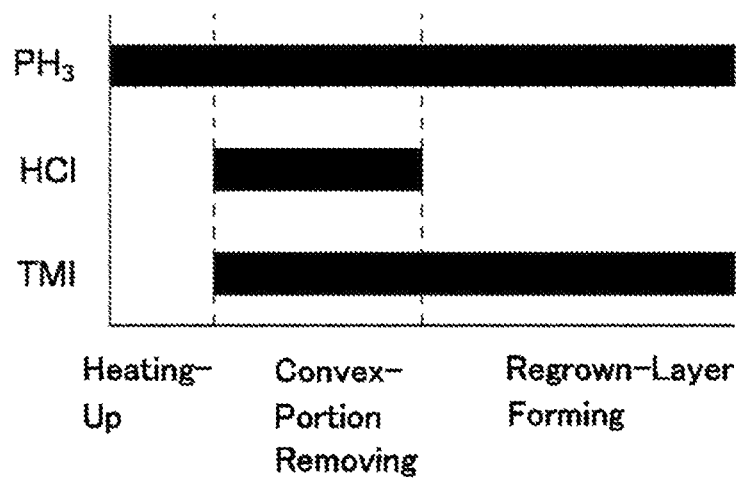
FIG. 6 is a diagram showing gas supply conditions in a method of manufacturing a semiconductor laser according to Embodiment 3.

Gas supply conditions in the manufacturing method according to Embodiment 3 are shown in FIG. 6. The difference from Embodiment 1 resides in that the TMI gas is supplied even in the convex-portion removing step. The HCl gas has a capability of etching a (001) plane surface, so that, when the HCl gas and the TMI gas are flowed concurrently, whether the (001) plane surface is actually etched or grown is determined depending on terms and conditions, such as, supply amounts of these gases, a temperature, a pressure and the like. Even if the (001) plane surface is etched, the etching rate is lower than in the case of Embodiment 1 and thus the etched amount at this surface decreases, so that the time taken for the formation of the second p-type InP cladding layer 30 in the following regrown-layer forming step will be reduced. On the other hand, when the (001) plane surface is grown, such a time reduction effect is enhanced.

Embodiment 4

A method of manufacturing a semiconductor laser according to Embodiment 4 will be described. Here, its steps similar to those in the manufacturing method according to Embodiment 1 will not be detailed, so that description will be made mainly on the difference from Embodiment 1. With respect also to an effect to be created, description will be made mainly on the difference from Embodiment 1.

Figure 7:
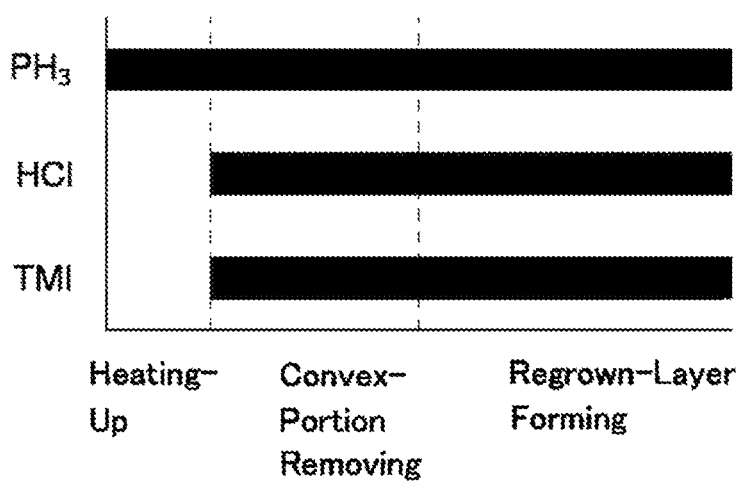
FIG. 7 is a diagram showing gas supply conditions in a method of manufacturing a semiconductor laser according to Embodiment 4.

Gas supply conditions in the manufacturing method according to Embodiment 4 are shown in FIG. 7. The difference from Embodiment 1 resides in that the TMI gas is supplied even in the convex-portion removing step and the HCl gas is supplied even in the regrown-layer forming step. In FIG. 7, although the convex-portion removing step and the regrown-layer forming step are shown as individual different steps, these steps may be regarded collectively as a single step, or may be regarded as different steps provided with a difference in condition, such as a gas flow rate or the like, between these steps.

In the manufacturing method according to Embodiment 4, using the HCl gas, the convex portion is removed in the convex-portion removing step and the regrown-layer forming step, so that an effect due to removal of the convex portion is ensured.

Further, since the TMI gas is supplied concurrently with the removal of the convex portion, the time taken for these steps can be reduced.

Embodiment 5

A method of manufacturing a semiconductor laser according to Embodiment 5 will be described. Here, its steps similar to those in the manufacturing method according to Embodiment 3 will not be detailed, so that description will be made mainly on the difference from Embodiment 3. With respect also to an effect to be created, description will be made mainly on the difference from Embodiment 3.

Figure 8:
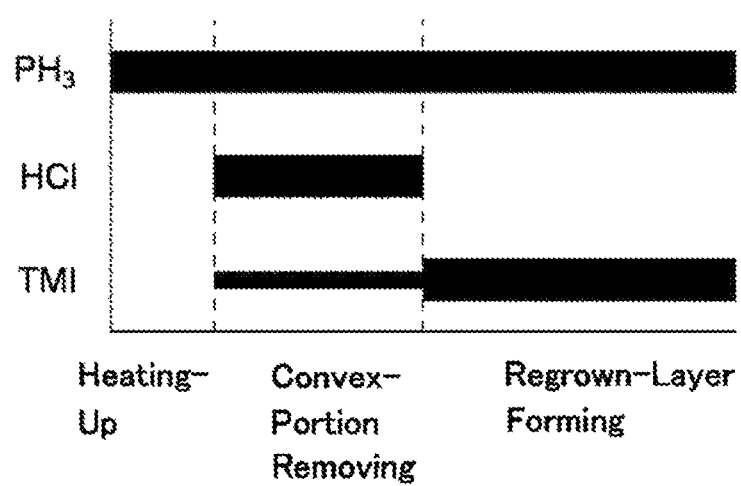
FIG. 8 is a diagram showing gas supply conditions in a method of manufacturing a semiconductor laser according to Embodiment 5.

Gas supply conditions in the manufacturing method according to Embodiment 5 are shown in FIG. 8. The difference from Embodiment 3 resides in that the flow rate of the TMI gas in the convex-portion removing step is lower than that in the regrown-layer forming step. Besides, the flow rate of the TMI gas in the convex-portion removing step is set so that the growth rate of the (001) plane surface and the etching rate of the (001) plane surface by the HCl gas, are nearly equal to each other. This makes it possible to remove only the convex portion almost without changing the height of the (001) plane surface. Accordingly, it is possible to maximize the removal effect of impurities on the boundary face. The reason is as follows. When the etching rate is low, crystals are grown before removal of the impurities, so that the boundary face remains dirty. Contrarily, when the etching rate is high, the other supplied material or an impurity adhering to the inside of the furnace will be reacted with the HCl gas to become easier to adhere to the surface. Thus, when the height of the (001) plane surface is unchanged, the removal effect of impurities on the boundary face becomes maximum.

Embodiment 6

A method of manufacturing a semiconductor laser according to Embodiment 6 will be described. Here, its steps similar to those in the manufacturing method according to Embodiment 4 will not be detailed, so that description will be made mainly on the difference from Embodiment 4. With respect also to an effect to be created, description will be made mainly on the difference from Embodiment 4.

Figure 9:
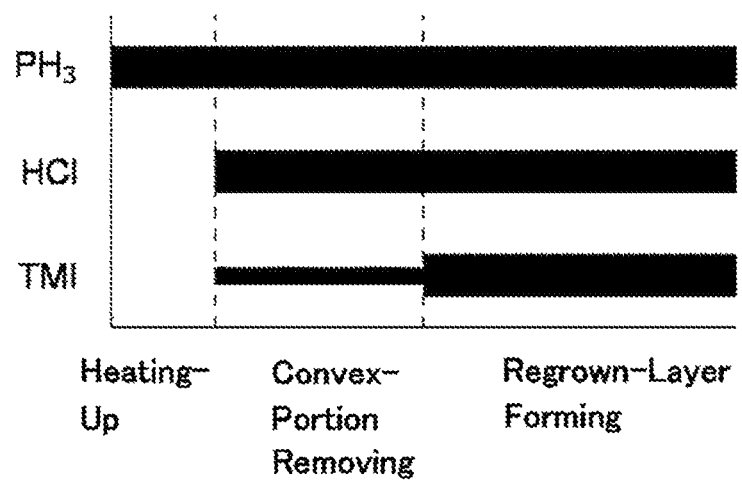
FIG. 9 is a diagram showing gas supply conditions in a method of manufacturing a semiconductor laser according to Embodiment 6.

Gas supply conditions in the manufacturing method according to Embodiment 6 are shown in FIG. 9. The difference from Embodiment 4 resides in that the flow rate of the TMI gas in the convex-portion removing step is lower than that in the regrown-layer forming step. Besides, the flow rate of the TMI gas in the convex-portion removing step is set so that the growth rate of the (001) plane surface and the etching rate of the (001) plane surface by the HCl gas, are nearly equal to each other. This makes it possible to remove only the convex portion almost without changing the height of the (001) plane surface. Accordingly, it is possible to maximize the removal effect of impurities on the boundary face.

Embodiment 7

A method of manufacturing an EML (Electro-absorption Modulator integrated Laser-diode) according to Embodiment 7 will be described. In FIGS. 10 and 11 for use in the description, laser light is emitted from the EML toward the left side of the paper. The EML is configured with: a DFB (Distributed FeedBack) portion for generating laser light; and an EA (Electro-Absorption) portion for controlling whether to emit externally or shut off the generated laser light.

Figure 10A:
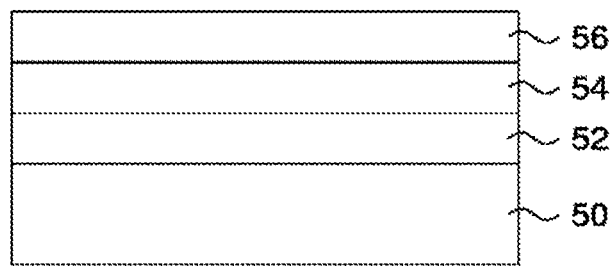
FIGS. 10A to 10D are cross-sectional views representing a method of manufacturing an EML according to Embodiment 7.
Figure 10B:
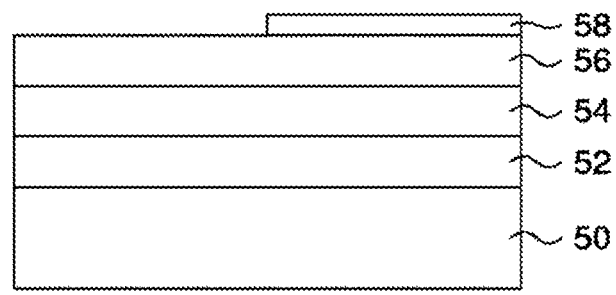
Figure 10C:
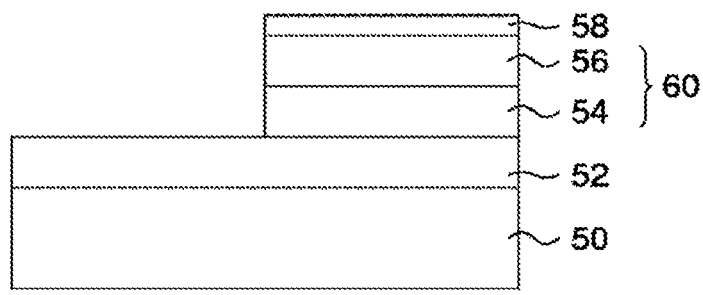
Figure 10D:
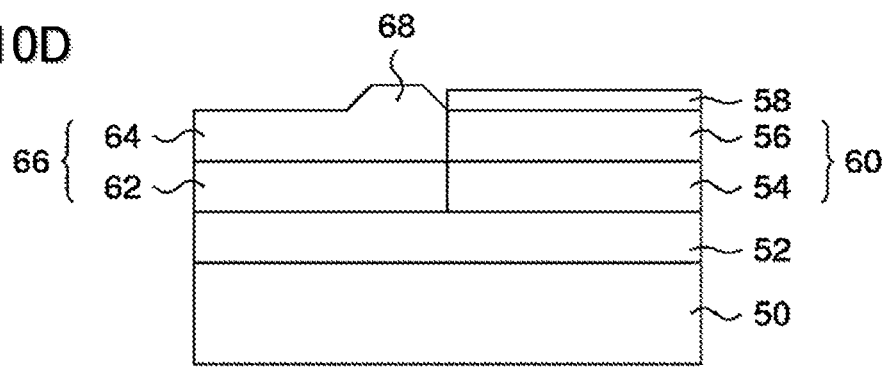

First, as shown in FIG. 10A, an n-type InP cladding layer 52 is epitaxially grown on an n-type InP substrate 50. The n-type InP substrate 50 with the n-type InP cladding layer 52 stacked thereon is referred to as a base member. Then, an InGaAsP active layer 54 and a first p-type InP cladding layer 56 are epitaxially grown successively. Then, as shown in FIG. 10B, an SiO₂ film is deposited and photo-etching using a resist pattern is applied thereto, to thereby form a stripe-shaped SiO₂ mask 58. Then, as shown in FIG. 10C, RIE as dry etching is applied so as to etch the portion uncovered by the SiO₂ mask 58 up to the lower side of the InGaAsP active layer 54, to thereby form a DFB structure 60. Then, as shown in FIG. 10D, in a region abutting on a side surface of the DFB structure 60, an InGaAsP core layer 62 and a second p-type InP cladding layer 64 are grown. The InGaAsP core layer 62 and the second p-type InP cladding layer 64 are referred collectively to as an EA structure 66. On this occasion, a convex portion 68 is formed on a surface of the EA structure 66 in the vicinity of the SiO₂ mask 58, in a manner as stated in the description of Embodiment 1. Then, using hydrofluoric acid, the SiO₂ mask 58 is removed to thereby achieve a structure of FIG. 11A.

Figure 11A:
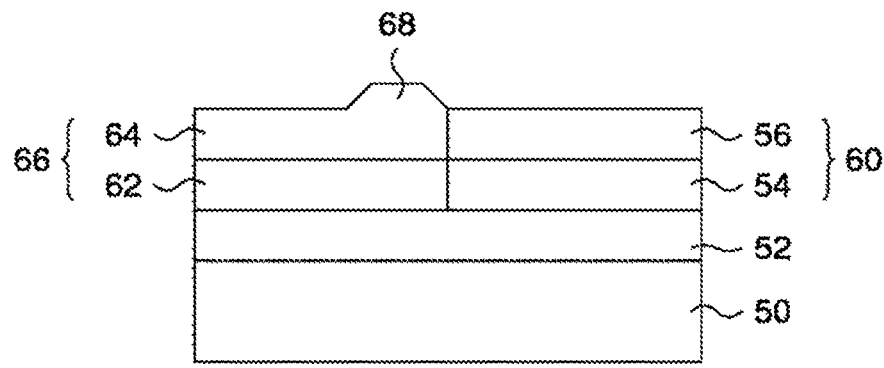
FIGS. 11A to 11C are cross-sectional views representing the method of manufacturing an EML according to Embodiment 7.
Figure 11B:
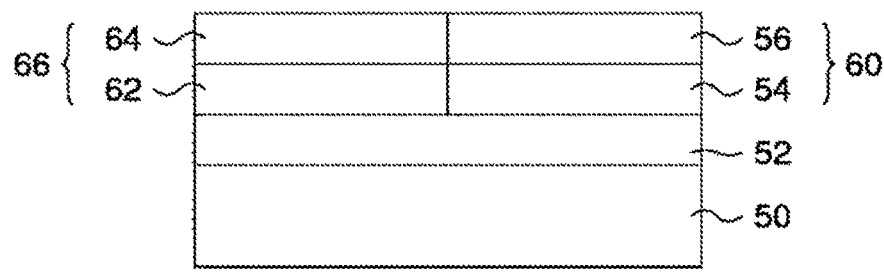

After the formation of the structure of FIG. 11A, as shown in FIG. 11B, the convex portion 68 is removed by etching using an HCl gas. The reason why the convex portion is removed is as stated in the description of Embodiment 1.

Figure 11C:
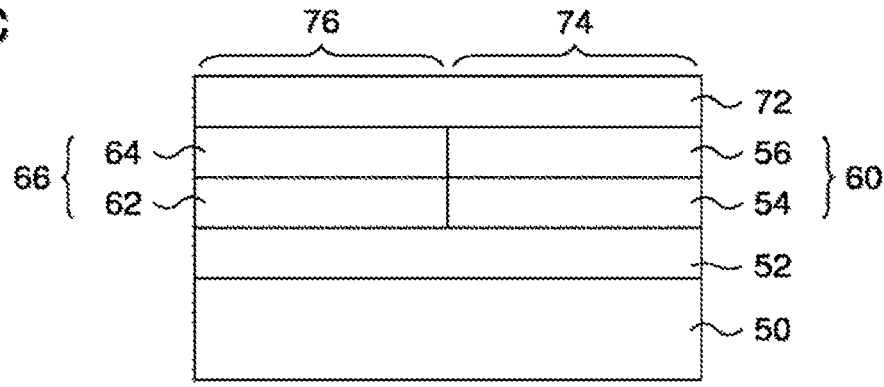

After the removal of the convex portion, under the condition that the thus-partially manufactured EML is not taken out from the manufacturing apparatus, a p-type InGaAs contact layer 72 is regrown thereon in such a manner that the supply of the HCl gas is stopped but a TMI gas as a material gas is flowed, to thereby achieve a structure shown in FIG. 11C. The gas supply conditions at this time are similar to those in FIG. 1. In FIG. 11C, the right side is a DFB portion 74 and the left side is an EA portion 76. Although a basic crystalline structure for the EML is thereafter completed through additional multiple steps, these steps are already known and thus will not be described here.

When an EML is manufactured using the manufacturing method according to Embodiment 7, the convex-portion-removed EA structure 66 is obtained, so that the effect stated in the description of Embodiment 1 will be achieved.

Further, the surfaces of the EA structure 66 and the DFB structure 60, after the removal of the convex portion, are not exposed to the atmosphere, so that the effect stated in the description of Embodiment 1 will be achieved.

In the foregoing description, the DFB structure 60 is firstly formed and thereafter the EA structure 66 is formed; however, it is allowed that the EA structure is firstly formed and thereafter the DFB structure is formed. In that case, although a convex portion is formed on the surface of the DFB structure, when the convex portion is removed as described above, an effect similar to that previously described will be achieved.

Further, the gas supply methods described in relation to Embodiments 2 to 6 may each be applied to the method of manufacturing an EML according to Embodiment 7. In these cases, respective effects already described in relation to Embodiments 2 to 6 will be achieved.

It is noted that, in the description of Embodiments 1 to 7, an HCl gas is used as an etching gas; however, another halogen-based etching gas may be used. Specific examples thereof include gases of $Cl_2$, $CCl_4$, $CBr_4$, $CCl_3Br$, TBCl (Tertiarybutyl chloride) and the like.

Further, in the description of Embodiments 1 to 7, manufacturing methods of a semiconductor laser or an EML are described; however, this invention may be applied to a structure other than these devices if it is to be manufactured through execution of etching using a selection mask and regrowth processing.

DESCRIPTION OF REFERENCE NUMERALS and SIGNS

10, 50: n-type InP substrate, 12, 52: n-type InP cladding layer, 14, 54: InGaAsP active layer, 16, 56: first p-type InP cladding layer, 18, 58: $SiO_2$ mask, 20: mesa structure, 26: InP burying layer, 28, 68: convex portion, 30: second p-type InP cladding layer, 32, 72: p-type InGaAs contact layer, 60: DFB structure, 62: InGaAsP core layer, 64: second p-type InP cladding layer, 66: EA structure, 74: DFB portion, 76: EA portion.

The invention claimed is:

1. A method of manufacturing a semiconductor device, comprising:
    a step of forming a first semiconductor layer on a base member;
    a step of forming a mask on the first semiconductor layer;
    a step of etching the first semiconductor layer by using the mask, to thereby form a semiconductor structure;
    a step of forming a second semiconductor layer in a region abutting on a side surface of the semiconductor structure, said second semiconductor layer having a convex portion abutting to the mask;
    a convex-portion removing step of removing the convex portion by supplying an etching gas thereto; and
    a regrown-layer forming step of supplying a material gas onto the semiconductor structure and the second semiconductor layer, to thereby form a regrown layer;
    wherein the convex-portion removing step and the subsequent regrown-layer forming step are successively executed in a same manufacturing apparatus.

2. The method of manufacturing a semiconductor device of claim 1, wherein the etching gas is supplied in the regrown-layer forming step.

3. The method of manufacturing a semiconductor device of claim 2, wherein the etching gas is a halogen-based gas.

4. The method of manufacturing a semiconductor device of claim 2, wherein the semiconductor structure is a mesa structure;
    wherein the second semiconductor layer is a current blocking layer; and
    wherein the semiconductor device is a semiconductor laser.

5. The method of manufacturing a semiconductor device of claim 2, wherein the semiconductor structure is a DFB structure;
    wherein the second semiconductor layer has an Electro-Absorption (EA) structure; and
    wherein the semiconductor device is an Electro-absorption Modulator integrated Laser-diode (EML).

6. The method of manufacturing a semiconductor device of claim 1, wherein the material gas is supplied in the convex-portion removing step.

7. The method of manufacturing a semiconductor device of claim 6, wherein a flow rate of the material gas in the convex-portion removing step is lower than that in the regrown-layer forming step.

8. The method of manufacturing a semiconductor device of claim 7, wherein a height of an area other than that of the convex portion is almost unchanged in the convex-portion removing step.

9. The method of manufacturing a semiconductor device of claim 6, wherein the etching gas is a halogen-based gas.

10. The method of manufacturing a semiconductor device of claim 6, wherein the semiconductor structure is a mesa structure;
    wherein the second semiconductor layer is a current blocking layer; and
    wherein the semiconductor device is a semiconductor laser.

11. The method of manufacturing a semiconductor device of claim 1, wherein the material gas is supplied in the convex-portion removing step, and the etching gas is supplied in the regrown-layer forming step.

12. The method of manufacturing a semiconductor device of claim 11, wherein a flow rate of the material gas in the convex-portion removing step is lower than that in the regrown-layer forming step.

13. The method of manufacturing a semiconductor device of claim 11, wherein the etching gas is a halogen-based gas.

14. The method of manufacturing a semiconductor device of claim 11, wherein the semiconductor structure is a mesa structure;
    wherein the second semiconductor layer is a current blocking layer; and
    wherein the semiconductor device is a semiconductor laser.

15. The method of manufacturing a semiconductor device of claim 1, wherein the etching gas is a halogen-based gas.

16. The method of manufacturing a semiconductor device of claim 1, wherein the semiconductor structure is a mesa structure;
    wherein the second semiconductor layer is a current blocking layer; and
    wherein the semiconductor device is a semiconductor laser.

17. The method of manufacturing a semiconductor device of claim 16, wherein the base member is a first-conductivity-type InP substrate;

wherein the first semiconductor layer includes, successively from a lower side thereof toward an upper side thereof, a first-conductivity-type InP cladding layer, an InGaAsP active layer and a first second-conductivity-type InP cladding layer;

wherein the second semiconductor layer is a semi-insulative InP burying layer;

wherein the regrown layer is a second second-conductivity-type InP cladding layer; and wherein the material gas is a TMI gas.

18. The method of manufacturing a semiconductor device of claim 1, wherein the semiconductor structure is a DFB structure;

wherein the second semiconductor layer has an Electro-Absorption (EA) structure; and wherein the semiconductor device is an Electro-absorption Modulator integrated Laser-diode (EML).

19. The method of manufacturing a semiconductor device of claim 18, wherein the base member is a first-conductivity-type InP substrate with a first-conductivity-type InP cladding layer stacked thereon;

wherein the first semiconductor layer includes, successively from a lower side thereof toward an upper side thereof, an InGaAsP active layer and a first second-conductivity-type InP cladding layer;

wherein the EA structure includes, successively from a lower side thereof toward an upper side thereof, an InGaAsP core layer and a second second-conductivity-type InP cladding layer;

wherein the regrown layer is a second-conductivity-type InGaAs contact layer; and wherein the material gas is a TMI gas.

20. The method of manufacturing a semiconductor device of claim 1, wherein the semiconductor structure is an Electro-Absorption (EA) structure;

wherein the second semiconductor layer has a DFB structure; and wherein the semiconductor device is an Electro-absorption Modulator integrated Laser-diode (EML).

* * * * *